United States Patent
Chindo

(10) Patent No.: US 8,736,386 B2
(45) Date of Patent: May 27, 2014

(54) GAS CELL UNIT AND ATOMIC OSCILLATOR

(75) Inventor: Koji Chindo, Saitama (JP)

(73) Assignee: Seiko Epson Corporation (JP)

( * ) Notice: Subject to any disclaimer, the term of this patent is extended or adjusted under 35 U.S.C. 154(b) by 20 days.

(21) Appl. No.: 13/554,250

(22) Filed: Jul. 20, 2012

(65) Prior Publication Data

US 2013/0027142 A1    Jan. 31, 2013

(30) Foreign Application Priority Data

Jul. 26, 2011    (JP) .................................. 2011-163706

(51) Int. Cl.
*H03L 7/26*    (2006.01)

(52) U.S. Cl.
USPC ............................... 331/94.1; 331/3; 331/176

(58) Field of Classification Search
CPC .......................................................... H03L 7/26
USPC ........................................... 331/3, 94.1, 176
See application file for complete search history.

(56) References Cited

U.S. PATENT DOCUMENTS

| 6,806,784 B2 | 10/2004 | Hollberg et al. |
| 7,999,626 B2 * | 8/2011 | Chindo et al. ............... 331/94.1 |
| 2006/0022761 A1 | 2/2006 | Abeles et al. |
| 2009/0315629 A1 | 12/2009 | Chindo et al. |

FOREIGN PATENT DOCUMENTS

| JP | 10-284772 | 10/1998 |
| JP | 2010-028794 | 2/2010 |

* cited by examiner

*Primary Examiner* — Arnold Kinkead
(74) *Attorney, Agent, or Firm* — Harness, Dickey & Pierce, P.L.C.

(57) ABSTRACT

A gas cell unit includes a gas cell in which a gaseous alkali metal atom is sealed, a first heater to heat the gas cell, and a second heater which is provide to face the first heater across the gas cell and heats the gas cell. The first heater includes a first heating resistor which generates heat by energization, and the second heater includes a second heating resistor through which a current flows in the same direction as the direction of a current flowing through the first heating resistor and which generates heat by energization. Between the first heating resistor and the second heating resistor, a magnetic field generated by the energization to the first heating resistor and a magnetic field generated by the energization to the second heating resistor are mutually cancelled or weakened.

6 Claims, 16 Drawing Sheets

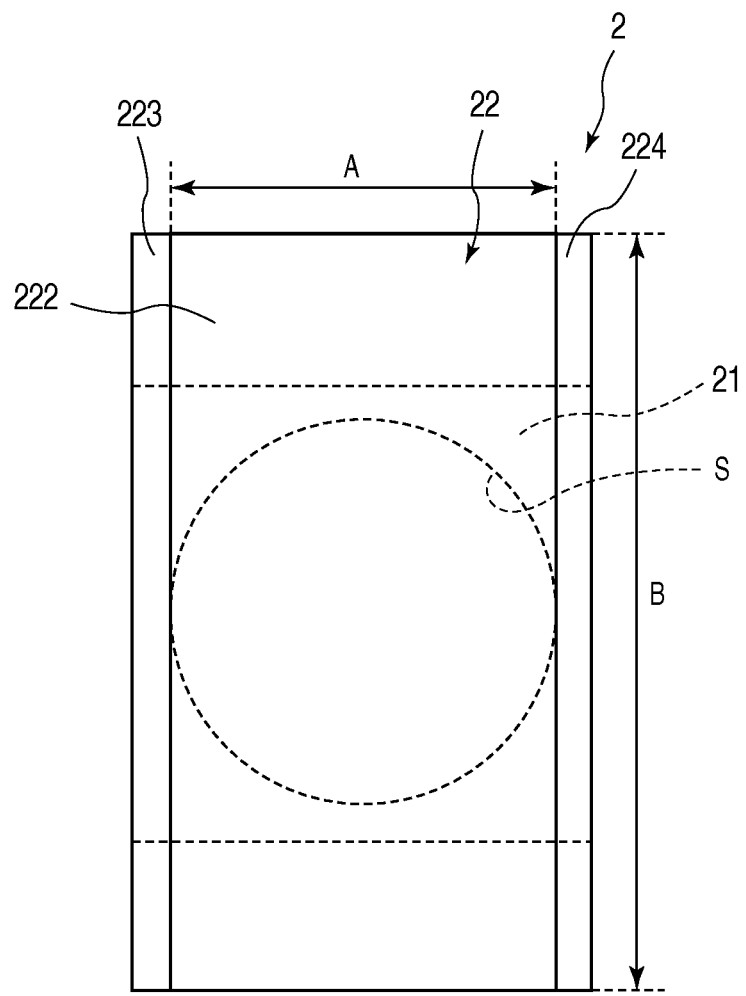
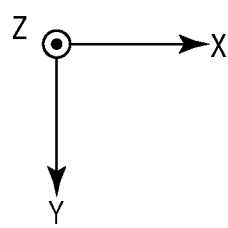
FIG. 6

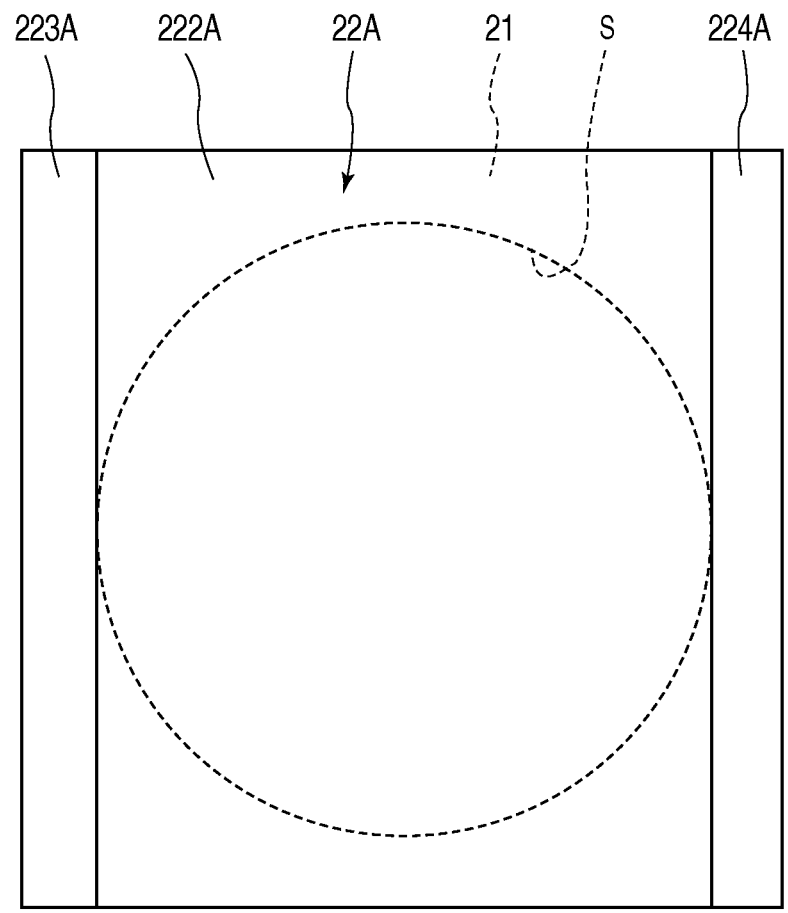
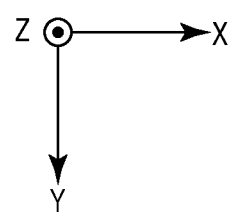
FIG. 11

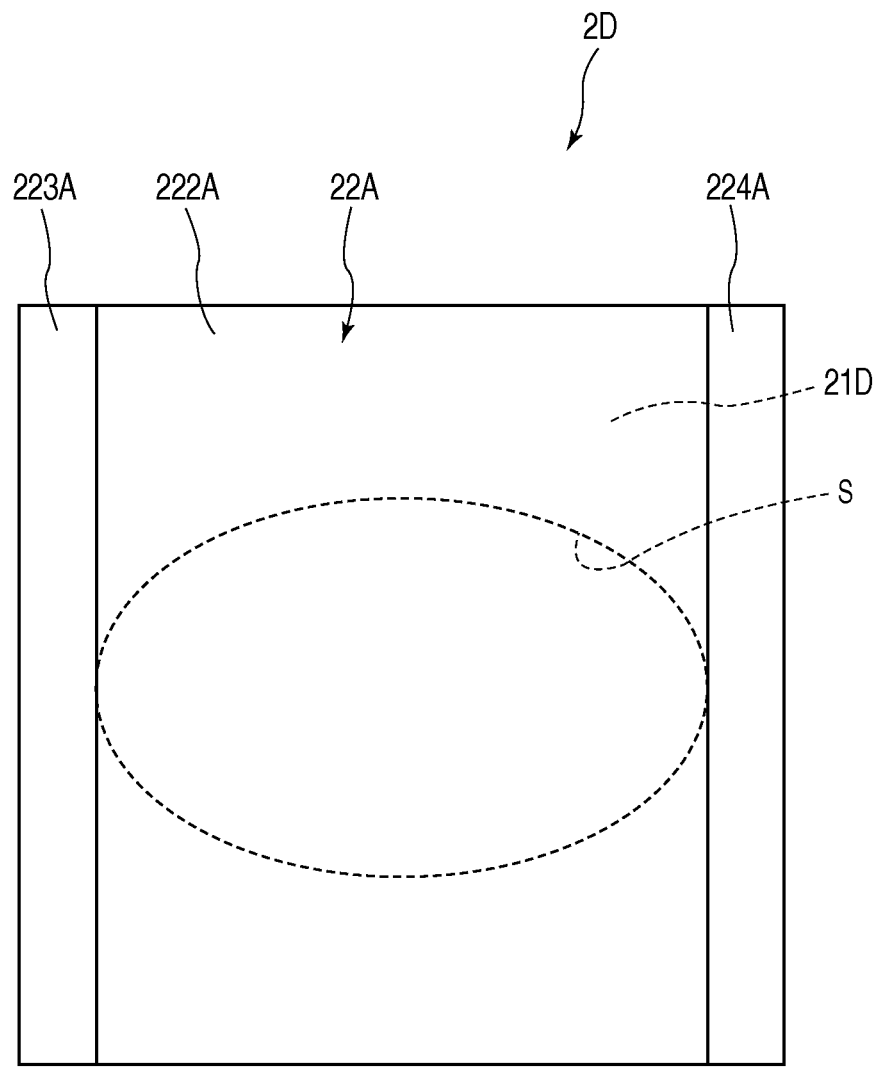
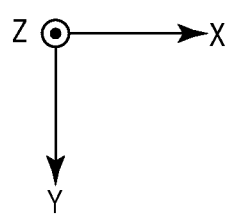
FIG. 15

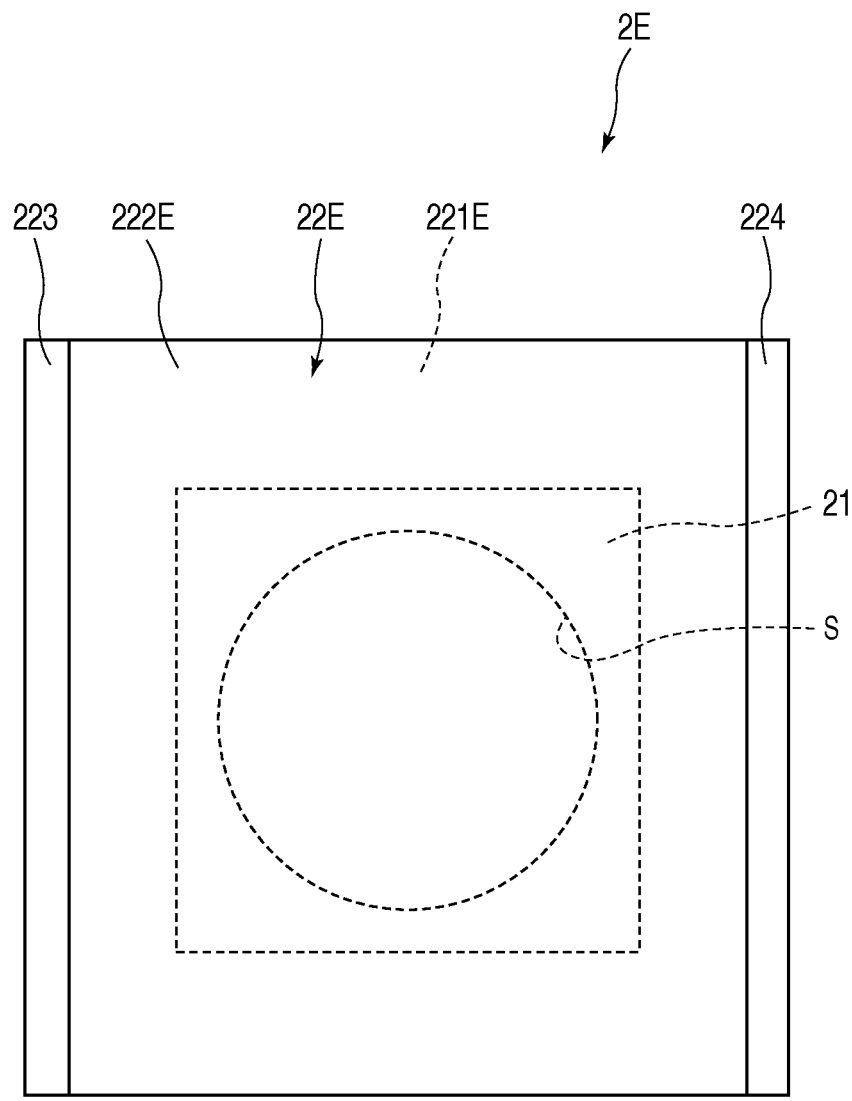
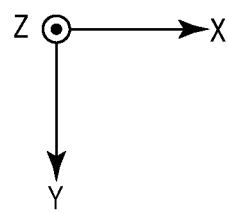
FIG. 16

GAS CELL UNIT AND ATOMIC OSCILLATOR

BACKGROUND

1. Technical Field

The present invention relates to a gas cell unit and an atomic oscillator.

2. Related Art

An atomic oscillator oscillating based on an energy transition in an alkali metal atom such as rubidium or cesium is generally classified into an atomic oscillator using a double resonance phenomenon of light and microwave (see, for example, JP-A-10-284772) and an atomic oscillator using a quantum interference effect (CPT: Coherent Population Trapping) of two kinds of lights different in wavelength (see, for example, U.S. Pat. No. 6,806,784).

In both the atomic oscillators, in general, the alkali metal, together with buffer gas, is sealed in a gas cell, and the gas cell is required to be heated to a specific temperature in order to keep the alkali metal in a gaseous state.

For example, in an atomic oscillator disclosed in US Patent Publication No. 2006/0022761, a film-like heater made of ITO is provided on the outer surface of a gas cell in which a gaseous metal atom is sealed, and the heater is heated by energization. By this, the gas cell is heated, and the metal atom in the gas cell can be kept in the gaseous state.

In the atomic oscillator as stated above, in general, current supplied to the heater is adjusted so that the temperature in the gas cell becomes constant. Thus, the current flowing through the heater is changed according to, for example, the change of outer temperature.

When the current flowing through the heater is changed as stated above, the magnetic field generated from the heater is also changed.

When the magnetic field generated from the heater is changed, a frequency corresponding to an energy difference between the ground levels of the metal atom in the gas cell is changed. Thus, in the related art atomic oscillator, there is a problem that the output frequency shifts.

SUMMARY

An advantage of some aspects of the invention is to provide a gas cell unit and an atomic oscillator, in which frequency accuracy can be improved.

Application Example 1

This application example of the invention is directed to a gas cell unit including a gas cell in which a gaseous alkali metal atom is sealed, a first heating resistor that is heated by energization and heats the gas cell, and a second heating resistor that is heated by energization and heats the gas cell. The first heating resistor and the second heating resistor face each other across the gas cell. A current flowing through the first heating resistor and a current flowing through the second heating resistor include current components flowing in a same direction, and a magnetic field generated in the gas cell by the energization to the first heating resistor and a magnetic field generated in the gas cell by the energization to the second heating resistor mutually weaken strengths of the magnetic fields in the gas cell.

According to the gas cell unit as stated above, even if the amounts of energization to the first heating resistor and the second heating resistor are changed, the variation of the magnetic field in the gas cell can be suppressed or prevented. Thus, the variation of the magnetic field in the gas cell is suppressed, and the temperature in the gas cell can be kept at a desired temperature. As a result, in this gas cell unit, the frequency accuracy can be improved.

Application Example 2

In the gas cell unit of the application example of the above application example, it is preferable that each of the first heating resistor and the second heating resistor extends to an outside of an area of the gas cell in which the alkali metal atom is sealed when viewed in plane.

With this configuration, the variation of the magnetic field in the whole area of the gas cell in which the alkali metal atom is sealed can be suppressed. As a result, the frequency accuracy can be easily and certainly improved.

Application Example 3

In the gas cell unit of the application example of the above application example, it is preferable that each of the first heating resistor and the second heating resistor is rectangular when viewed in plane, and the current flows in a direction parallel to a short side.

With this configuration, the variation of the magnetic field in the whole area of the gas cell in which the alkali metal atom is sealed can be more certainly suppressed.

Application Example 4

In the gas cell unit of the application example of the above application example, it is preferable that a pair of electrodes are provided along a pair of long sides on each of the first heating resistor and the second heating resistor.

With this configuration, the current can be made to uniformly flow in the direction parallel to the short side of the first heating resistor and the second heating resistor. Thus, the heat generation distribution and the magnetic field distribution of the first heating resistor and the second heating resistor can be uniformed, and the temperature and the magnetic field in the gas cell can be uniformed. As a result, the frequency accuracy of the gas cell unit can be made excellent.

Application Example 5

In the gas cell unit of the application example of the above application example, it is preferable that a pair of magnetic shielding conductors are provided along a pair of short sides on each of the first heating resistor and the second heating resistor.

With this configuration, the variation of the magnetic field in the whole area of the gas cell in which the alkali metal atom is sealed can be more certainly suppressed.

Application Example 6

In the gas cell unit of the application example of the above application example, it is preferable that the gas cell unit further includes a first heater including the first heating resistor and a first substrate on one surface of which the first heating resistor is provided, and a second heater including the second heating resistor and a second substrate on one surface of which the second heating resistor is provided.

With this configuration, the first heating resistor and the second heating resistor are easily installed.

Application Example 7

This application example of the invention is directed to an atomic oscillator including the gas cell unit, a light exit part to emit an exciting light to excite the alkali metal atom in the gas cell, and a light detection part to detect an intensity of the exciting light passing through the gas cell.

With this configuration, the atomic oscillator having the excellent frequency accuracy can be provided.

BRIEF DESCRIPTION OF THE DRAWINGS

The invention will be described with reference to the accompanying drawings, wherein like numbers reference like elements.

FIG. 6 is a plan view showing the gas cell unit shown in FIG. 4.

FIG. 11 is a plan view showing the gas cell unit shown in FIG. 10.

FIG. 15 is a plan view showing a gas cell unit of a fifth embodiment of the invention.

FIG. 16 is a plan view showing a gas cell unit of a sixth embodiment of the invention.

DESCRIPTION OF EXEMPLARY EMBODIMENTS

Hereinafter, a gas cell unit and an atomic oscillator according to embodiments of the invention will be described with reference to the accompanying drawings.

First Embodiment

Figure 1:
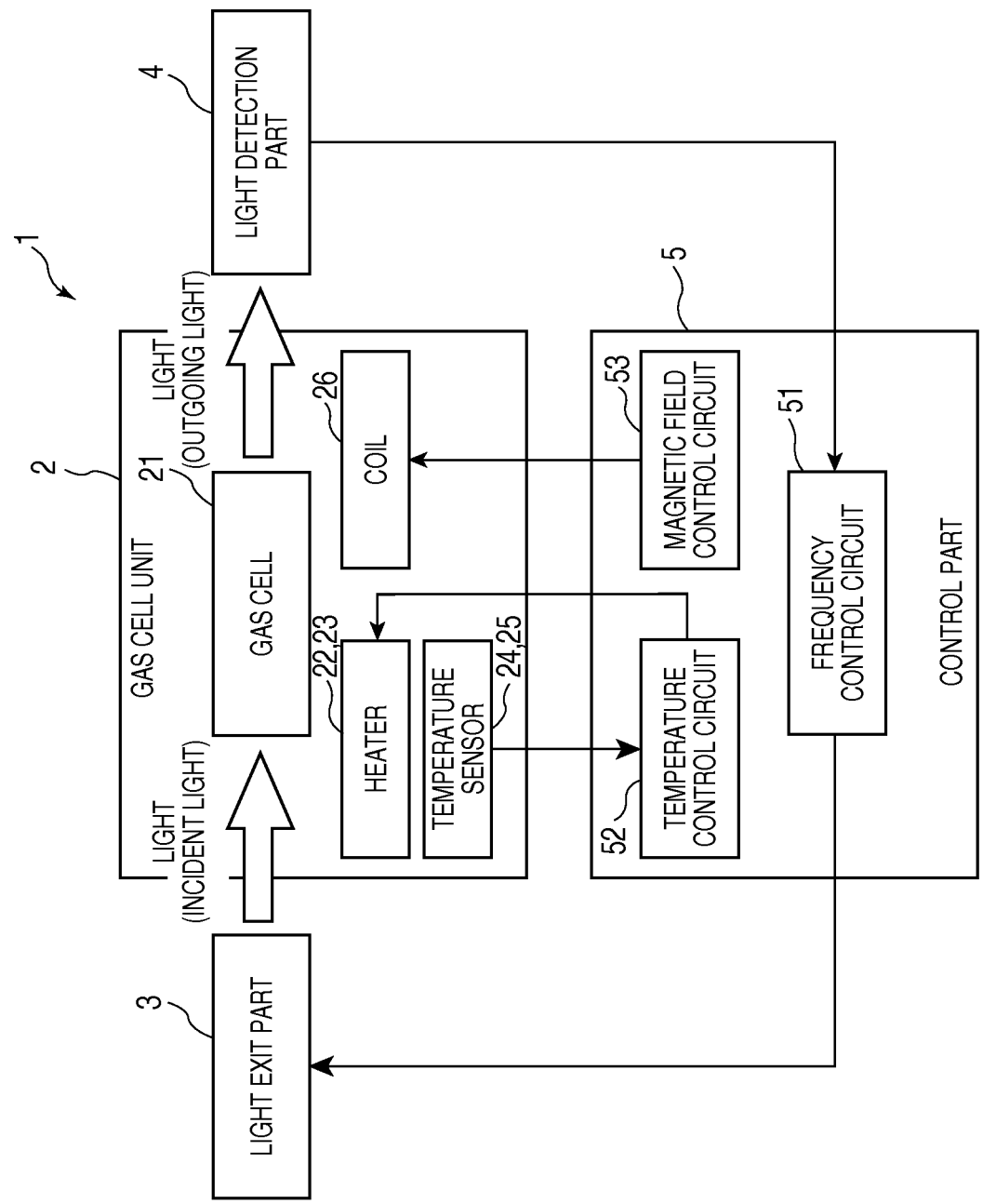
FIG. 1 is a block diagram showing a schematic structure of an atomic oscillator of a first embodiment of the invention.
Figure 2:
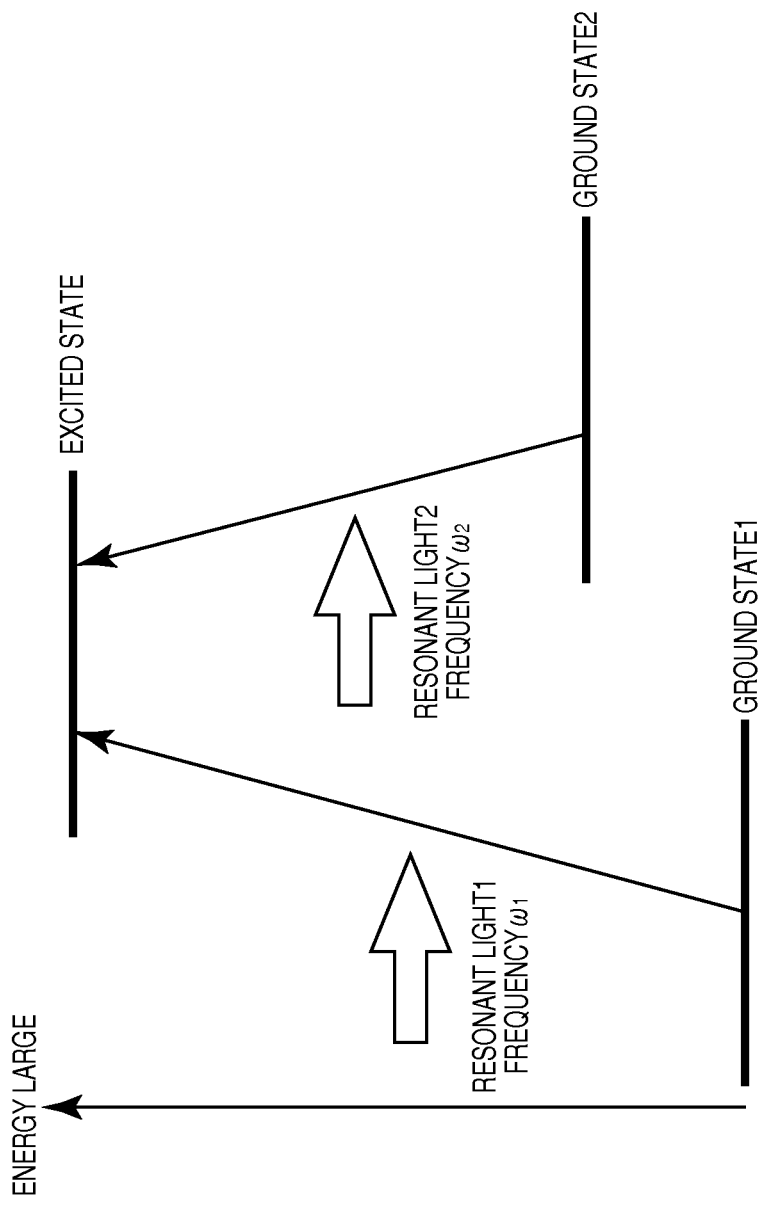
FIG. 2 is a view for explaining an energy state of an alkali metal in a gas cell provided in the atomic oscillator shown in FIG. 1.
Figure 3:
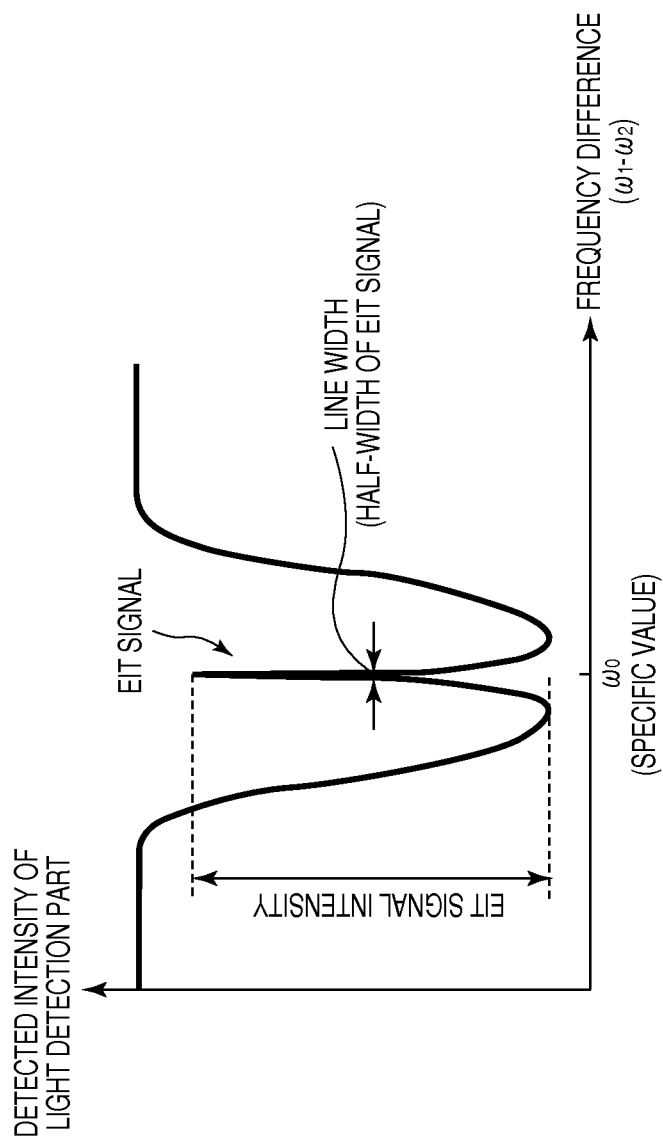
FIG. 3 is a graph showing a relation between the frequency difference of two lights from a light exit part and the detection intensity of a light detection part with respect to the light exit part and the light detection part provided in the atomic oscillator shown in FIG. 1.
Figure 4:
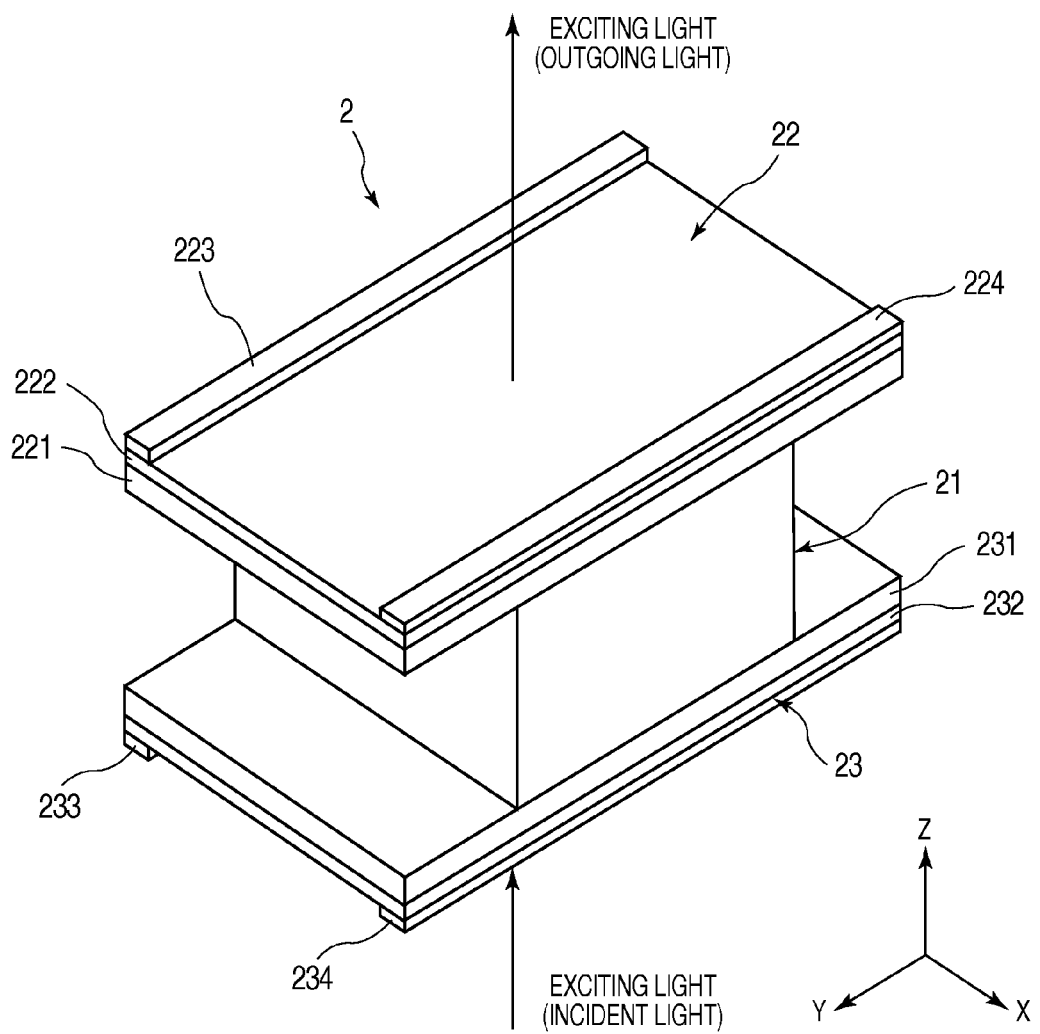
FIG. 4 is a perspective view showing a schematic structure of a gas cell unit provided in the atomic oscillator shown in FIG. 1.
Figure 5:
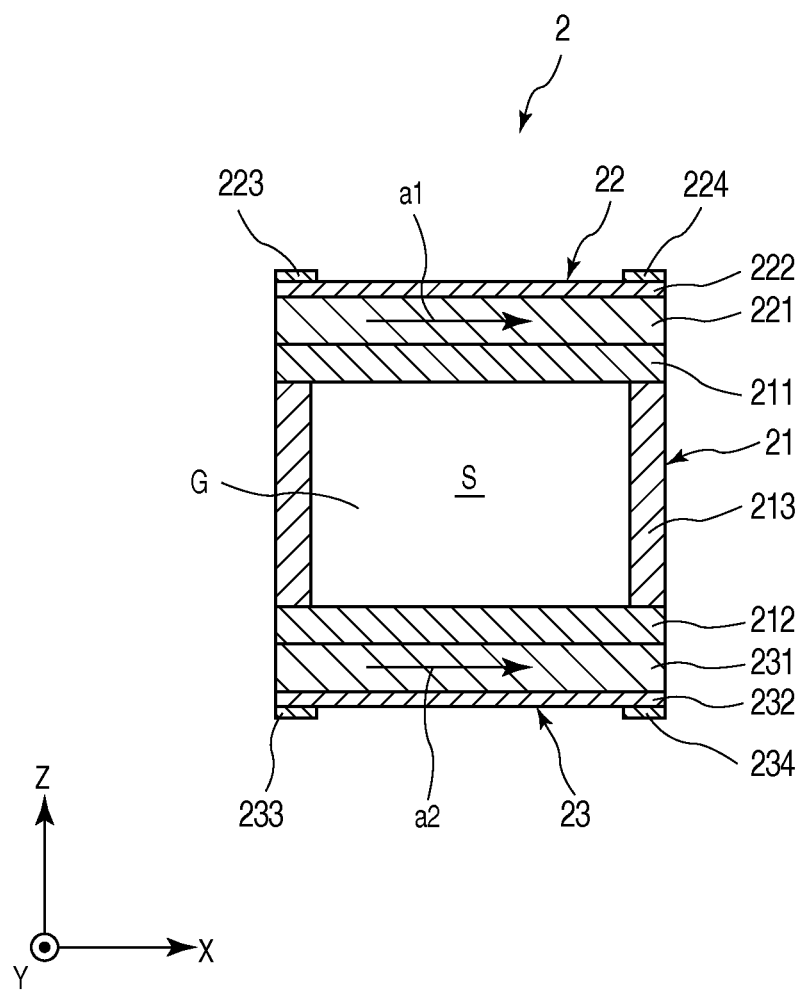
FIG. 5 is a sectional view showing the gas cell unit shown in FIG. 4.
Figure 7:
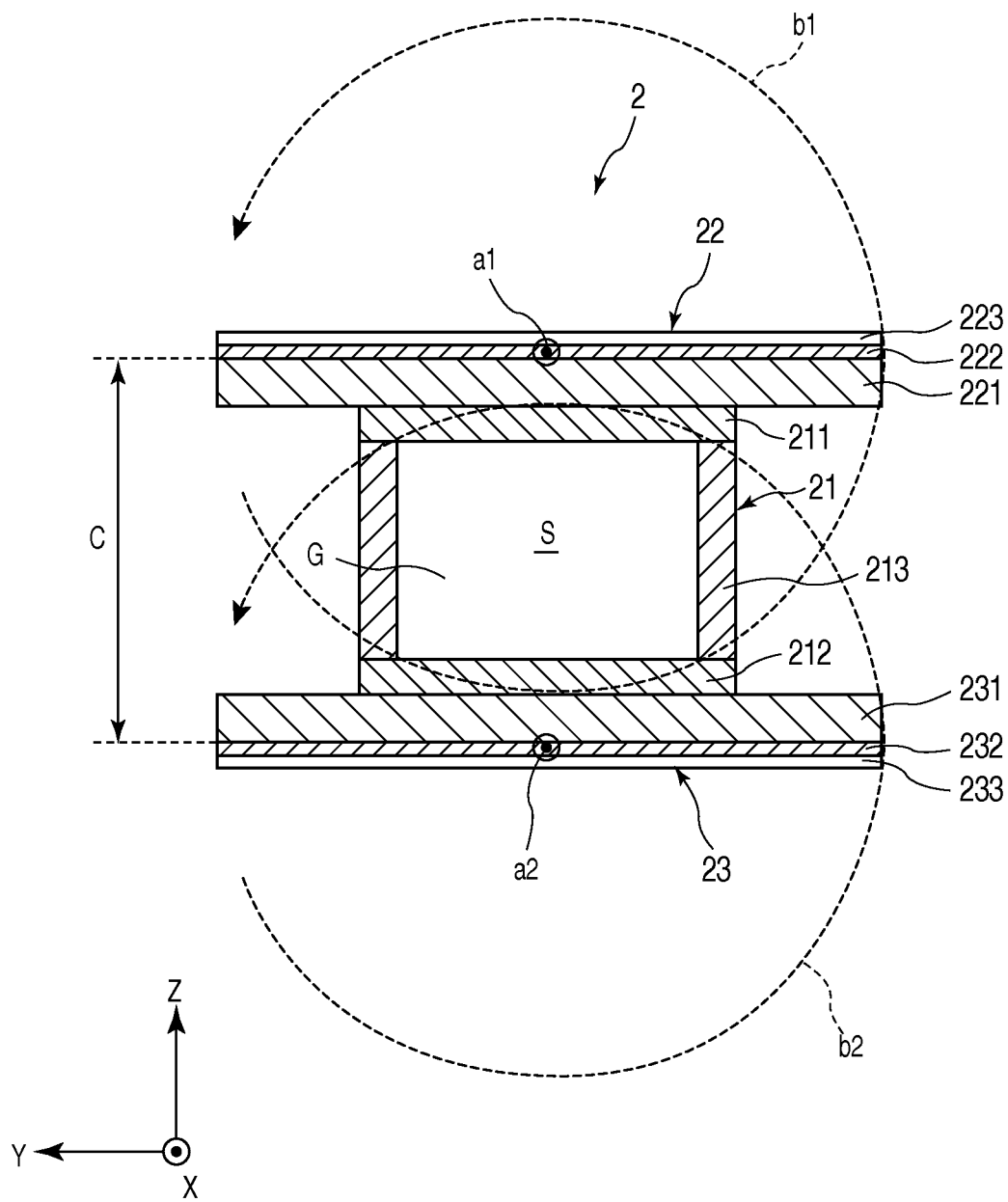
FIG. 7 is a view (sectional view) for explaining the operation of the gas cell unit shown in FIG. 4.
Figure 8A:
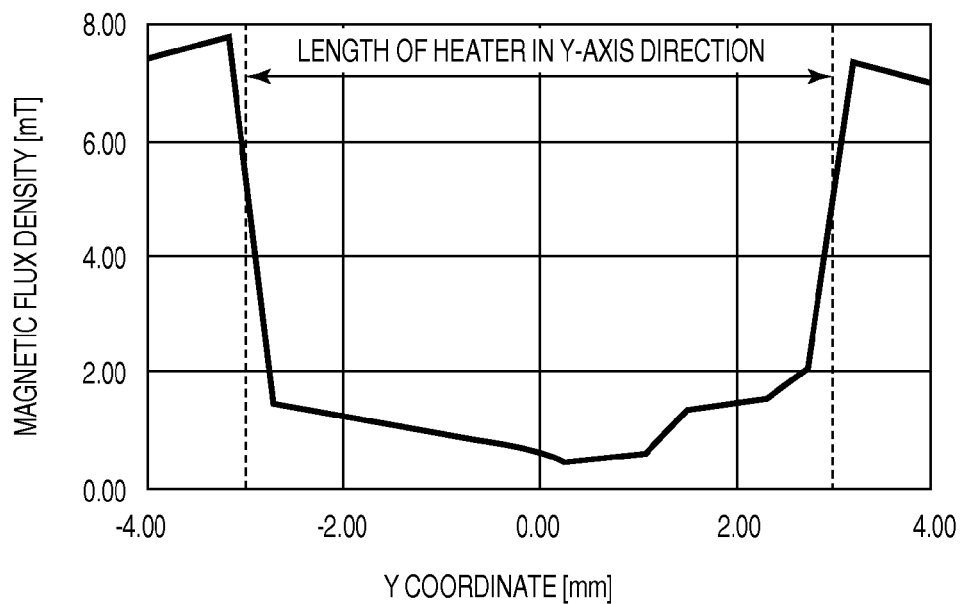
FIG. 8A is a graph for explaining a magnetic flux density between two heaters when currents having the same direction flow through two heaters.
Figure 8B:
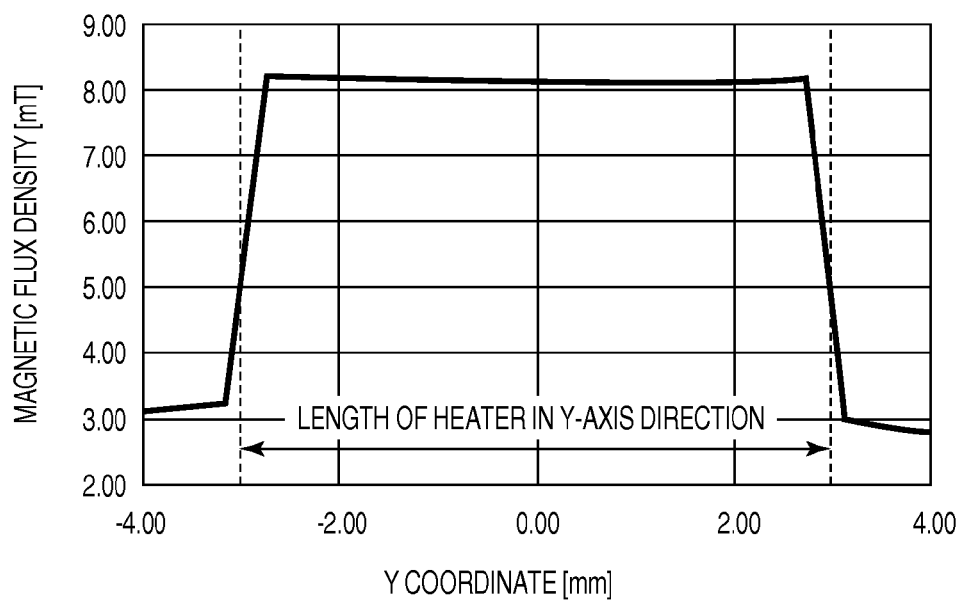
FIG. 8B is a graph for explaining a magnetic flux density between the two heaters when currents having opposite directions flow through the two heaters.
Figure 9:
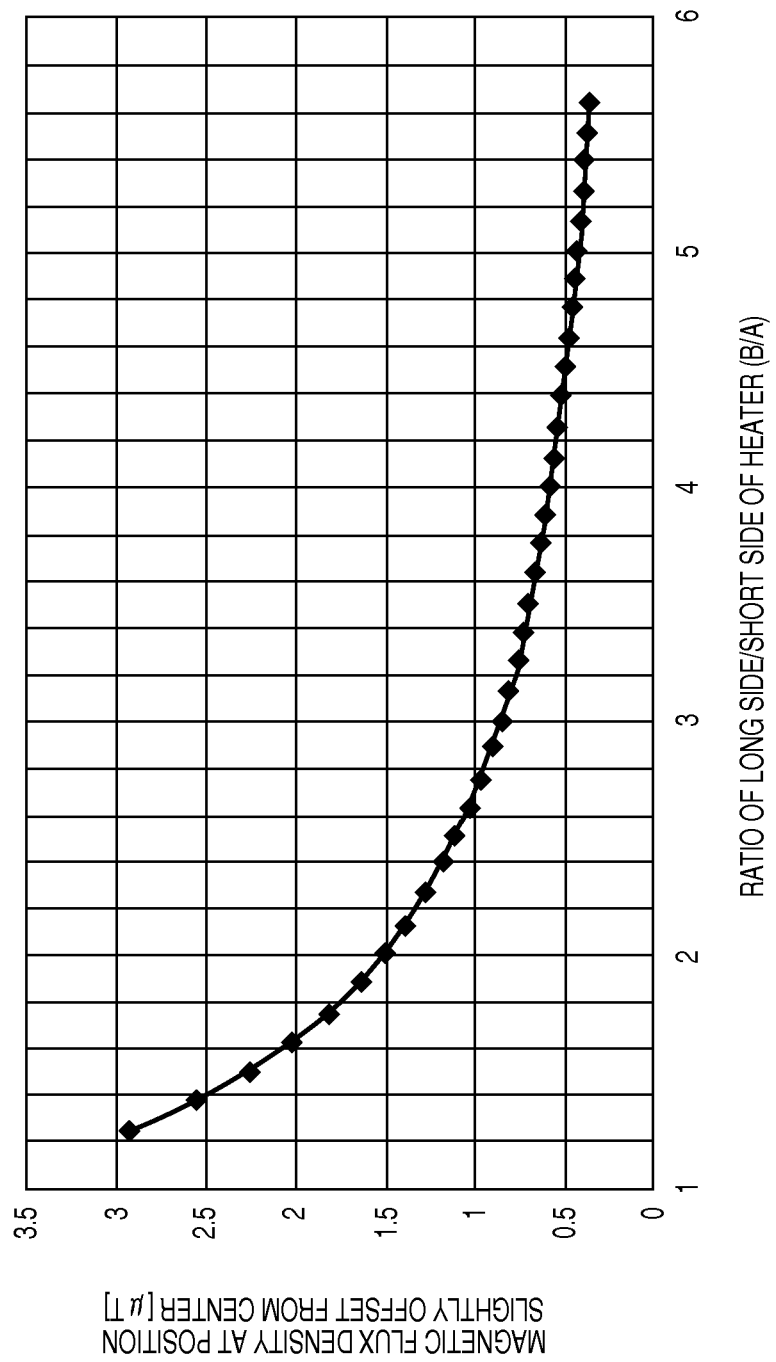
FIG. 9 is a graph showing a relation between the ratio of a long side to a short side of a heater and a magnetic flux density between two heaters.

FIG. 1 is a block diagram showing a schematic structure of an atomic oscillator of a first embodiment of the invention, FIG. 2 is a view for explaining an energy state of an alkali metal in a gas cell provided in the atomic oscillator shown in FIG. 1, FIG. 3 is a graph showing a relation between the frequency difference of two lights from a light exit part and the detection intensity of a light detection part with respect to the light exit part and the light detection part provided in the atomic oscillator shown in FIG. 1, FIG. 4 is a perspective view showing a schematic structure of a gas cell unit provided in the atomic oscillator shown in FIG. 1, FIG. 5 is a sectional view showing the gas cell unit shown in FIG. 4, FIG. 6 is a plan view showing the gas cell unit shown in FIG. 4, FIG. 7 is a view (sectional view) for explaining the operation of the gas cell unit shown in FIG. 4, FIG. 8A is a graph for explaining a magnetic flux density between two heaters when currents having the same direction flow through two heaters, FIG. 8B is a graph for explaining a magnetic flux density between the two heaters when currents having opposite directions flow through the two heaters, and FIG. 9 is a graph showing a relation between the ratio of a long side to a short side of a heater and a magnetic flux density between two heaters. Incidentally, in the following, for convenience of the explanation, the upper side in FIGS. 4, 5 and 7 is called "upper", and the lower side is called "lower". Besides, in FIGS. 4 to 7, for convenience of the explanation, an X axis, a Y axis and a Z axis are shown as three axes perpendicular to each other, and a direction parallel to the X axis is "X-axis direction", a direction parallel to the Y axis is "Y-axis direction", and a direction (up and down direction) parallel to the Z axis is "Z-axis direction".

Atomic Oscillator

First, the whole structure of the atomic oscillator of this embodiment will be described in brief with reference to FIG. 1 to FIG. 3.

Incidentally, in the following, although the description will be made while using, as an example, a case where the invention is applied to the atomic oscillator using a quantum interference effect, the invention is not limited to this and can also be applied to an atomic oscillator using a double resonance phenomenon.

An atomic oscillator 1 shown in FIG. 1 includes a gas cell unit 2, a light exit part 3, a light detection part 4 and a control part 5.

Besides, the gas cell unit 2 includes a gas cell 21 in which a gaseous alkali metal is sealed, heaters 22 and 23 to heat the gas cell 21, temperature sensors 24 and 25 to detect the temperature of the gas cell 21, and a coil 26 to generate a magnetic field acting on the gas cell 21.

The alkali metal such as gaseous rubidium, cesium or sodium is sealed inside the gas cell 21.

As shown in FIG. 2, the alkali metal has energy levels of a three-level system, and can have three states, that is, two ground states (ground states 1 and 2) different in energy level, and an excited state. Here, the ground state 1 is an energy state lower than the ground state 2.

When two kinds of resonant lights 1 and 2 different from each other in frequency are irradiated to the gaseous alkali metal, the optical absorptance (optical transmittance) of the resonant lights 1 and 2 in the alkali metal changes according to a difference ($\omega_1-\omega_2$) between a frequency $\omega_1$ of the resonant light 1 and a frequency $\omega_2$ of the resonant light 2.

When the difference ($\omega_1-\omega_2$) between the frequency $\omega_1$ of the resonant light 1 and the frequency $\omega_2$ of the resonant light 2 coincides with a frequency corresponding to an energy difference between the ground state 1 and the ground state 2, excitations from the ground states 1 and 2 to the excited state are respectively stopped. At this time, the resonant lights 1 and 2 are not absorbed by the alkali metal but pass through.

The phenomenon as stated above is called a CPT phenomenon or an electromagnetically induced transparency (EIT) phenomenon.

The light exit part 3 emits exciting light to excite the alkali metal atom in the gas cell 21.

More specifically, the light exit part 3 emits two kinds of lights (the resonant light 1 and the resonant light 2) different from each other in frequency.

The frequency $\omega 1$ of the resonant light 1 can excite the alkali metal in the gas cell 21 from the ground state 1 to the excited state.

Besides, the frequency $\omega 2$ of the resonant light 2 can excite the alkali metal in the gas cell 21 from the ground state 2 to the excited state.

The exciting light (the resonant lights 1 and 2) preferably has coherence.

The light exit part 3 as stated above can be constructed of, for example, a laser light source such as a semiconductor laser.

The light detection part 4 detects the intensities of the resonant lights 1 and 2 passing through the gas cell 21.

For example, in the light exit part 3, the frequency $\omega 1$ of the resonant light 1 is fixed and the frequency $\omega 2$ of the resonant light 2 is changed. Then, when the difference ($\omega 1 - \omega 2$) between the frequency $\omega 1$ of the resonant light 1 and the frequency $\omega 2$ of the resonant light 2 coincides with the frequency $\omega 0$ corresponding to the energy difference between the ground state 1 and the ground state 2, the detection intensity of the light detection part 4 abruptly rises as shown in FIG. 3. Such an abrupt signal is detected as an EIT signal. The EIT signal has an intrinsic value determined according to the kind of the alkali metal. Accordingly, an oscillator can be constructed by using the EIT signal as stated above.

The light detection part 4 as stated above can be constructed of, for example, a light detector to output a detection signal corresponding to the intensity of received light.

The control part 5 has a function to control the heaters 22 and 23 and the light exit part 3.

The control part 5 includes a frequency control circuit 51 to control the frequencies of the resonant lights 1 and 2 of the light exit part 3, a temperature control circuit 52 to control the temperature of the alkali metal in the gas cell 21, and a magnetic field control circuit 53 to control a magnetic field to be applied to the gas cell 21.

The frequency control circuit 51 controls the frequencies of the resonant lights 1 and 2 emitted from the light exit part 3 based on the detection result of the light detection part 4. More specifically, the frequency control circuit 51 controls the frequencies of the resonant lights 1 and 2 emitted from the light exit part 3 so that ($\omega 1 - \omega 2$) detected by the light detection part 4 becomes the frequency $\omega 0$ intrinsic to the alkali metal.

The temperature control circuit 52 controls energization to the heaters 22 and 23 based on the detection results of the temperature sensors 24 and 25.

The magnetic field control circuit 53 controls energization to the coil 26 so that the magnetic field generated by the coil 26 becomes constant.

Gas Cell Unit

Next, the gas cell unit 2 will be described.

As shown in FIG. 4, the gas cell unit 2 includes a gas cell 21, and a pair of heaters 22 and 23 provided to sandwich the gas cell 21.

Gas Cell

As shown in FIG. 5, the gas cell 21 includes a pair of plate-like parts 211 and 212 and a spacer 213 provided between them.

The plate-like parts 211 and 212 respectively have transparency to the exciting light from the light exit part 3. In this embodiment, the exciting light incident into the gas cell 21 passes through the plate-like part 212, and the exiting light outgoing from the gas cell 21 passes through the plate-like part 211.

In this embodiment, each of the plate-like parts 211 and 212 has a plate shape. Besides, the plate-like parts 211 and 212 are quadrangular when viewed in plane. Incidentally, the shapes of the plate-like parts 211 and 212 are not limited to the foregoing, and may be, for example, circular when viewed in plane.

A material constituting the plate-like parts 211 and 212 is not limited as long as the material has transparency to the exciting light, and for example, glass material, crystal and the like can be enumerated.

The spacer 213 forms a space S between the pair of plate-like parts 211 and 212. The alkali metal as stated before is sealed in the space S.

In this embodiment, the spacer 213 has a frame shape or a tube shape, and both the outer periphery and the inner periphery are respectively quadrangular. Incidentally, the shape of the spacer 213 is not limited to the foregoing, and for example, both the outer periphery and the inner periphery may be circular when viewed in plane.

The spacer 213 is hermetically connected to the respective plate-like parts 211 and 212. By this, the space S between the pair of plate-like parts 211 212 can be made a hermetic space. A connecting method of the spacer 213 and the plate-like parts 211 and 212 is determined according to the constituent material of the spacer 213 and the plate-like parts 211 and 212, and is not specifically limited. For example, a connecting method using an adhesive, a direct connecting method, an anode connecting method or the like can be used.

A material constituting the spacer 213 is not specifically limited, and metal material, resin material or the like may be used, or similarly to the plate-like parts 211 and 212, glass material, crystal or the like may be used.

Heater

Each of the heaters 22 and 23 has a function to heat the gas cell 21 (more specifically, the alkali metal in the gas cell 21). By this, the vapor pressure of the alkali metal in the gas cell 21 is kept at a specific pressure value or more, and a desired amount of alkali metal can be kept in a gaseous state.

In this embodiment, the heaters 22 and 23 are provided to sandwich the gas cell 21 and are arranged to be symmetrical with respect to the gas cell 21 (vertically symmetrical with respect to the gas cell 21 in the section shown in FIG. 5). Incidentally, the heaters 22 and 23 may be arranged to be asymmetrical with respect to the gas cell 21.

The heater (first heater) 22 includes a substrate (first substrate) 221, a heating resistor (first heating resistor) 222 provided on one surface (upper surface in FIG. 5) of the substrate 221, and a pair of electrodes 223 and 224 provided on the heating resistor 222.

Similarly, the heater (second heater) 23 includes a substrate (second substrate) 231, a heating resistor (second heating resistor) 232 provided on one surface (lower surface in FIG. 5) of the substrate 231, and a pair of electrodes 233 and 234 provided on the heating resistor 232.

The direction of current flowing through the heating resistor 222 of the heater 22 is the same as the direction of current flowing through the heating resistor 232 of the heater 23. Between the heating resistor 222 and the heating resistor 232, the magnetic field generated in the gas cell 21 by energization to the heating resistor 222 and the magnetic field generated in the gas cell 21 by energization to the heating resistor 232 mutually cancel or weaken the strengths of the magnetic fields in the gas cell 21. Incidentally, the direction of the current flowing through the heating resistor 222 may be slightly different from the direction of the current flowing through the heating resistor 232. In this case, since it is conceivable that the current flowing through the heating resistor 222 and the current flowing through the heating resistor 232 respectively include current components flowing in the same direction, the magnetic fields generated in the gas cell 21 can be mutually cancelled or weakened by the current components flowing in the same direction.

By this, even if the amounts of energization to the heating resistor 222 and the heating resistor 232 are changed, the variation of the magnetic field in the gas cell 21 can be suppressed or prevented. Thus, the variation of the magnetic field in the gas cell 21 is suppressed, and the temperature in the gas cell 21 can be kept at a desired temperature. As a result, the frequency accuracy of the gas cell unit 2 can be improved.

Incidentally, with respect to the heater (first heater) 22, the heating resistor (first heating resistor) 222 may be provided on the other surface (lower surface in FIG. 5) of the substrate 221. In this case, the electrodes 223 and 224 are formed on the one surface (upper surface in FIG. 5) of the substrate 221, and through-holes for connecting the electrodes 223 and 224 and the heating resistor 222 may be formed in the substrate 221. Alternatively, the electrodes 223 and 224 are formed on the upper surface and the side surface of the substrate 221, and the heating resistor 222 and the electrodes 223 and 224 may be connected to each other through the side surface of the substrate 221.

Alternatively, the width of the substrate 221 in the X-axis direction is made slightly larger than the width of the gas cell 21 in the X-axis direction, and the electrodes 223 and 224 may be formed on a portion of the lower surface of the substrate 221 protruding to the outside of the gas cell 21. Since the heating resistor 222 can be brought into direct contact with the gas cell 21 by the structure as stated above, the gas cell 21 can be effectively heated. Since the heater (second heater) 23 is similar to the heater 22, the description thereof will be omitted.

Hereinafter, the respective parts of the heater 22 will be described in detail. Incidentally, since the structure of the heater 23 is similar to the structure of the heater 22, the description thereof will be omitted.

The substrate 221 supports the heating resistor 222. By this, the installation of the heating resistor 222 becomes easy.

In this embodiment, the substrate 221 is quadrangular (more specifically, rectangular) when viewed in plane. Incidentally, the shape of the substrate 221 when viewed in plane is not limited to the rectangle, and may be another quadrangle such as a square, a rhombus or a trapezoid, or may be another polygon such as a triangle or a pentagon, or may be a circle, an ellipse, an irregular shape or the like.

The substrate 221 has an insulating property. By this, a short circuit between the respective parts of the heating resistor 222 is prevented, and the heating resistor 222 can be heated by energization.

Besides, the substrate 221 has transparency to the exciting light to excite the alkali metal atom in the gas cell 21. By this, the heater 22 can be provided on the light path of the exciting light. Thus, the exit part of the exciting light of the gas cell 21 can be more effectively heated by the heater 22. Incidentally, in this embodiment, as shown in FIG. 4, the exciting light is incident into the gas cell 21 through the heater 23, and is emitted from the gas cell 21 through the heater 22.

A constituent material of the substrate 221 is not specifically limited as long as the material has the insulating property and the light transparency and can withstand the heat generation of the heating resistors 222 and 223, and for example, a glass material, a crystal or the like can be used.

Besides, the thickness of the substrate 221 is not specifically limited, and is, for example, about 0.01 to 10 mm.

The heating resistor 222 is provided on the substrate 221 on the opposite side to the gas cell 21.

The heating resistor 222 generates heat by energization. Besides, in this embodiment, the heating resistor 222 has transparency to the exciting light to excite the alkali metal atom in the gas cell 21. By this, the exit part of the exciting light of the gas cell 21 can be efficiently heated by the heater 22.

Besides, the heating resistor 222 has a thin film shape. By this, the heating resistor 222 can be formed easily and at high accuracy by film formation.

In this embodiment, the heating resistor 222 is uniformly formed on the whole area of the upper surface of the substrate 221. Accordingly, the heating resistor 222 is rectangular when viewed in plane.

Besides, as shown in FIG. 6, the heating resistor 222 includes the area (space S) of the gas cell 21 in which the alkali metal atom is sealed when viewed in plane, and extends to the outside of the area. By this, the variation of the magnetic field of the whole area in the space S can be suppressed. As a result, the frequency accuracy can be easily and certainly improved.

A constituent material of the heating resistor 22 is not specifically limited as long as the material generates heat by energization and has light transparency to the exciting light. For example, it is preferable to use a transparent electrode material of an oxide such as ITO (Indium Tin Oxide), IZO (Indium Zinc Oxide), $In_3O_3$, $SnO_2$, $SnO_2$ containing Sb or ZnO containing Al.

The transparent electrode material as stated above has appropriate light transparency, and can efficiently generate heat by energization.

Besides, when the heating resistor 222 is made of the transparent electrode material, the heater 22 can be provided on the light path of the exciting light. Thus, the exit part of the exciting light of the gas cell 21 can be efficiently heated by the heater 22.

The thickness of the heating resistor 222 is not specifically limited, and is, for example, about 0.1 μm or more and 1 mm or less.

Besides, formation of the heating resistor 222 is not specifically limited, and can be performed by using, for example, a chemical vapor deposition (CVD) method such as plasma CVD or thermal CVD, a dry plating method such as vacuum evaporation, a sol-gel method or the like.

The electrodes 223 and 224 are provided on the surface of the heating resistor 222 opposite to the substrate 221.

The electrode 223 is provided along one (left in FIG. 5) long side of the rectangular substrate 221, and the electrode 224 is provided along the other (right in FIG. 5) long side of the substrate 221.

The electrodes 223 and 224 are provided to be spaced from each other in the X-axis direction. In this embodiment, the distance between the pair of electrodes 223 and 224 is uniform in the whole area in the Y-axis direction.

Besides, each of the electrodes 223 and 224 has a band shape extending along the Y-axis direction. Each of the electrodes 223 and 224 is provided over the whole area of the heating resistor 222 in the Y-axis direction.

Voltage is applied to the pair of electrodes 223 and 224 provided along the pair of long sides on the heating resistor 222, so that current can be made to uniformly flow in the direction parallel to the short side of the heating resistor 222. That is, power can be fed to the heating resistor 222 at a uniform potential over the whole area in the Y-axis direction. Thus, the heat generation distribution and the magnetic field distribution of the heating resistor 222 can be uniformed, and the temperature and the magnetic field in the gas cell 21 can be realized. As a result, the frequency accuracy of the gas cell unit 2 can be made excellent.

Especially, when the current is made to flow in the direction parallel to the short side of the heating resistor 222 having the rectangular shape when viewed in plane, as compared with the case where the current is made to flow in the direction parallel to the long side of the heating resistor 222, it is possible to prevent the magnetic field generated by energization of the heating resistor 222 from penetrating to the center of the gas cell 21. Thus, the variation of the magnetic field of the whole area in the area (space S) of the gas cell 21 in which the alkali metal atom is sealed can be more certainly suppressed.

A constituent material of the electrodes 223 and 224 is not limited, and a material excellent in conductivity is preferably used. For example, a metal material such as aluminum, aluminum alloy, silver, silver alloy, gold, gold alloy, chromium and chromium alloy are enumerated.

Besides, the thickness of the electrodes 223 and 224 is not specifically limited, and is, for example, about 0.1 μm or more and 1 mm or less.

As the forming method of the electrodes 223 and 224, a physical film formation method such as a sputtering method or a vacuum evaporation method, a chemical evaporation method such as CVD, various coating methods such as an ink jet method, and the like can be enumerated.

The electrodes 223 and 224 are electrically connected to the temperature control circuit 52, and a voltage is applied between the electrode 223 and the electrode 224.

When the voltage is applied between the electrode 223 and the electrode 224, the heating resistor 222 is energized. Similarly, when a voltage is applied between the electrode 233 and the electrode 234, the heating resistor 232 is energized.

At this time, the direction of current flowing through the heating resistor 222 and the direction of current flowing through the heating resistor 232 by the energization are equal to each other. Specifically, the current flows through the heating resistor 222 in the direction indicated by an arrow a1 of FIG. 5 from the electrode 223 to the electrode 224, and the current flows through the heating resistor 232 in the direction indicated by an arrow a2 of FIG. 5 from the electrode 233 to the electrode 234. Thus, in the area between the heating resistor 222 and the heating resistor 232, a direction b1 of a magnetic field generated from the heating resistor 222 and a direction b2 of a magnetic field generated from the heating resistor 232 are opposite to each other. By this, in the gas cell 21, as shown in FIG. 8A, the magnetic field generated from the heating resistor 222 and the magnetic field generated from the heating resistor 232 can be made to cancel or weaken each other.

Incidentally, FIG. 5 shows, as an example, a case where the electrodes 223 and 233 are cathodes, and the electrodes 224 and 234 are anodes, and the directions of the arrows a1 and a2 (the same applies to the directions of the arrows b1 and b2) may be opposite to those shown in the drawing. Besides, the length of the heater in the Y-axis direction and the absolute value of the magnetic flux density in FIGS. 8A and 8B are an example, and the invention is not limited to this.

On the other hand, if the direction of the current flowing through the heating resistor 222 is opposite to the direction of the current flowing through the heating resistor 232, in the area between the heating resistor 222 and the heating resistor 232, the direction of the magnetic field generated from the heating resistor 222 is equal to the direction of the magnetic field generated from the heating resistor 232. As a result, in the gas cell 21, as shown in FIG. 8B, the magnetic field generated from the heating resistor 222 and the magnetic field generated from the heating resistor 232 intensify each other.

When the length of each of the heating resistors 222 and 232 in the X-axis direction is A, and the length of each of the heating resistors 222 and 232 in the Y-axis direction is B, as shown in FIG. 9, the magnetic flux density at a position slightly shifted from the center of the gas cell 21 becomes small as B/A becomes large.

Here, FIG. 9 shows, as example, a case where a distance (C shown in FIG. 7) between the heating resistor 222 and the heating resistor 232 is fixed to 4 mm, and A is fixed to 4 mm. Besides, in FIG. 9, the position slightly shifted from the center of the gas cell 21 is the position shifted from the center of the gas cell 21 by 1 mm in each of the +X-axis direction, the +Y-axis direction and the +Z-axis direction. Besides, the length A of each of the heating resistors 222 and 232 in the X-axis direction is the length of a portion of each of the heating resistors 222 and 232 substantially functioning as the heater in the X-axis direction. Besides, the length B of each of the heating resistors 222 and 232 in the Y-axis direction is the length of a portion of each of the heating resistors 222 and 232 functioning as the heater in the Y-axis direction. Besides, the portion of the heating resistor 222 substantially functioning as the heater is an area of the heating resistor 22 sandwiched between the pair of electrodes 223 and 224 when viewed in plane. Similarly, the portion of the heating resistor 232 substantially functioning as the heater is the area of the heating resistor 232 sandwiched between the pair of electrodes 233 and 234 when viewed in plane.

Besides, as is understood from FIG. 9, B/A is preferably 1 or more and 5 or less, is more preferably 1 or more and 3 or less, and is still further preferably 1.5 or more and 2.5 or less. By this, upsizing of the heaters 22 and 23 is prevented, and the magnetic fields generated from the two heating resistors 222 and 232 in the gas cell 21 can be effectively cancelled or weakened.

On the other hand, if B/A is less than the lower limit value, the magnetic field at the position shifted from the center in the gas cell 21 becomes large, and a bad influence may be exerted on the frequency accuracy. On the other hand, if B/A exceeds the upper limit value, there is a tendency that the heaters 22 and 23 become large. Besides, even if B/A is made larger than the upper limit value, the magnetic field at the position shifted from the center in the gas cell 21 is not reduced any more.

Temperature Sensor

The gas cell unit 2 includes the temperature sensors 24 and 23. The amount of heat generation of the heaters 22 and 23 is controlled based on the detection results of the temperature sensors 24 and 25. By this, the alkali metal atom in the gas cell 21 can be kept at a desired temperature.

The temperature sensor 24 detects the temperature of the heater 22 or the plate-like part 211 of the gas cell 21. The temperature sensor 25 detects the temperature of the heater 23 or the plate-like part 212 of the gas cell 21.

The installation position of the temperature sensors 24 and 25 is not specifically limited. Although not shown, for example, the temperature sensor 24 is provided above the heater 22 or in the vicinity of the plate-like part 211 at the outer surface of the gas cell 21, and the temperature sensor 25 is provided above the heater 23 or in the vicinity of the plate-like part 212 at the outer surface of the gas cell 21.

The temperature sensors 24 and 25 are not specifically limited, and various well-known sensors such as a thermistor and a thermocouple can be used.

The temperature sensors 24 and 25 are electrically connected to the temperature control circuit 52 through a not-shown wiring.

The temperature control circuit 52 controls the amount of energization to the heater 22 based on the detection result of the temperature sensor 24. Besides, the temperature control circuit 52 controls the amount of energization to the heater 23 based on the detection result of the temperature sensor 25.

As stated above, the two temperature sensors 24 and 25 are used to control the amounts of energization to the heaters 22 and 23, so that higher accurate temperature control can be performed. Besides, the variation of temperature in the gas cell 21 (difference between temperatures at the incident side and the exit side of the exciting light) can be prevented.

The temperature control circuit 52 preferably controls the amounts of energization to the heaters 22 and 23 so that the difference between the amount of energization to the heater 22 and the amount of energization to the heater 23 becomes constant. By this, between the heating resistor 222 of the heater 22 and the heating resistor 232 of the heater 23, even if the amounts of energization to the heating resistors 222 and 232 are respectively changed, the magnetic fields generated by the energization to the heating resistors 222 and 232 can be mutually properly cancelled or weakened.

Coil

The gas cell unit 2 includes the coil 26 (see FIG. 1).

The coil 26 generates magnetic field by energization. By this, the magnetic field is applied to the alkali metal in the gas cell 21, so that a gap between different degenerate energy states of the alkali metal is widened, and the resolution can be improved. As a result, the accuracy of the oscillation frequency of the atomic oscillator 1 can be raised.

The installation position of the coil 26 is not specifically limited, and although not shown, for example, the coil may be provided to be wound along the outer periphery of the gas cell 21 so as to constitute a solenoid type, or a pair of coils may be made opposite to each other through the gas cell 21 so as to constitute a Helmholtz type.

The coil 26 is electrically connected to the magnetic field control circuit 53 through a not-shown wiring. By this, energization to the coil 26 can be performed.

A constituent material of the coil 26 is not specifically limited. For example, silver, copper, palladium, platinum, gold or alloy of these can be enumerated, and one or two kinds of these can be combined and used.

According to the gas cell unit 2 of this embodiment described above, between the heating resistor 222 and the heating resistor 232, the magnetic fields generated by the energization to the heating resistors 222 and 232 are mutually cancelled or weakened. Thus, even if the amounts of energization to the heaters 22 and 23 are changed, the change of the magnetic field in the gas cell 21 can be suppressed or prevented. Thus, the change of the magnetic field in the gas cell 21 is suppressed, and the temperature in the gas cell 21 can be kept at a desired temperature. As a result, in the gas cell unit 2, the frequency accuracy can be improved.

Besides, according to the atomic oscillator 1 including the gas cell unit 2 as described above, the excellent frequency accuracy is obtained.

Second Embodiment

Next, a second embodiment of the invention will be described.

Figure 10:
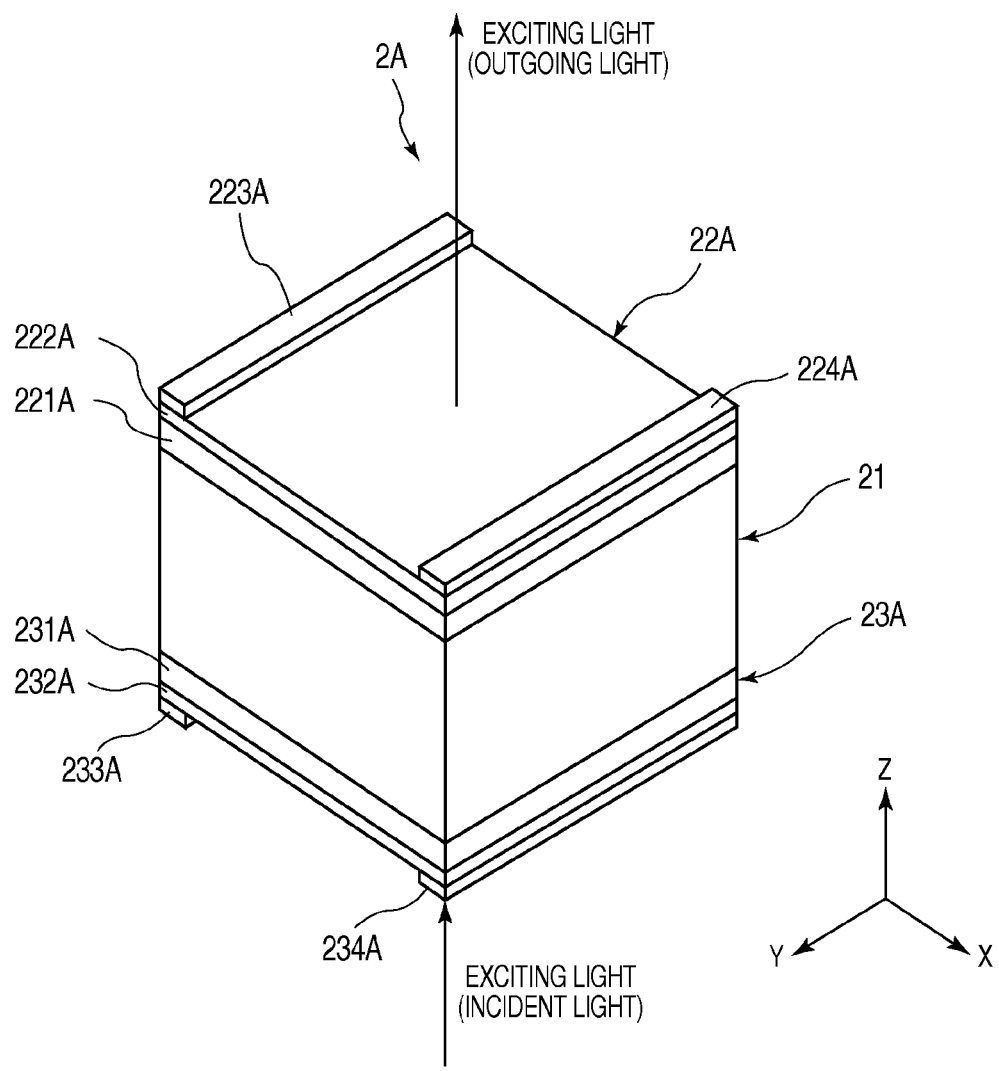
FIG. 10 is a perspective view showing a schematic structure of a gas cell unit of a second embodiment of the invention.
Figure 12:
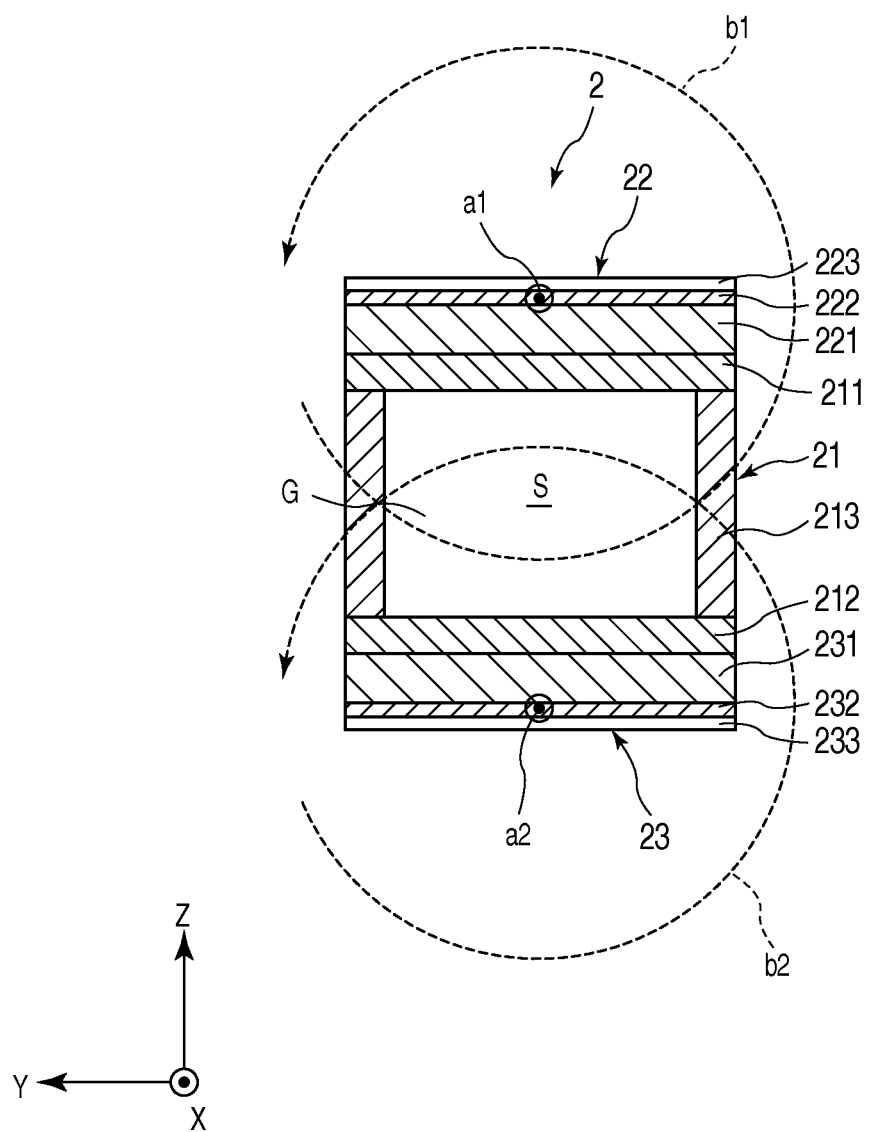
FIG. 12 is a view (sectional view) for explaining the operation of the gas cell unit shown in FIG. 10.

FIG. 10 is a perspective view showing a schematic structure of a gas cell unit of the second embodiment of the invention, FIG. 11 is a plan view showing the gas cell unit shown in FIG. 10, and FIG. 12 is a view (sectional view) for explaining the operation of the gas cell unit shown in FIG. 10.

The gas cell unit of this embodiment is similar to the gas cell unit of the first embodiment except for the length of a heater in a Y-axis direction.

Incidentally, in the following description, with respect to the gas cell unit of the second embodiment, different points from the first embodiment will be mainly described, and the description of similar items will be omitted. Besides, in FIG. 10 to FIG. 12, a similar component to that of the foregoing embodiment is denoted by the same reference numeral.

A gas cell unit 2A shown in FIG. 10 includes a pair of heaters 22A and 23A provided to sandwich a gas cell 21.

The heater (first heater) 22A includes a substrate 221A, a heating resistor (first heating resistor) 222A provided on one surface of the substrate 221A, and a pair of electrodes 223A and 224A provided on the heating resistor 222A.

Similarly, the heater (second heater) 23A includes a substrate 231A, a heating resistor (second heating resistor) 232A provided on one surface of the substrate 231A, and electrodes 233A and 234A provided on the heating resistor 232A.

Hereinafter, respective parts of the heater 22a will be described. Incidentally, since the structure of the heater 23A is similar to the structure of the heater 22A, the description thereof will be omitted.

In this embodiment, each of the substrate 221A and the heating resistor 222A is quadrangular (more specifically, square) when viewed in plane.

Besides, as shown in FIG. 11, the heating resistor 222A includes an area (space S) of the gas cell 21 in which an alkali metal atom is sealed when viewed in plane, and the heating resistor 222A extends to the outside of this area (space S). By this, the variation of the magnetic field of the whole area in the space S can be suppressed. As a result, the frequency accuracy can be easily and certainly improved.

In this embodiment, the width of the heating resistor 222A in the X-axis direction is coincident with the area (space S) of the gas cell 21 in which the alkali metal atom is sealed when viewed in plane. By this, the gas cell unit 2A can be miniaturized.

In the heater 22A, voltage is applied between the electrode 223A and the electrode 224A, so that energization is performed to the heating resistor 222A. Similarly, in the heater 23A, when voltage is applied between the electrode 233A and the electrode 234A, energization is performed to the heating resistor 232A.

At this time, the direction of current flowing through the heating resistor 222A and the direction of current flowing through the heating resistor 232A by the energization are equal to each other. Specifically, the current flows through the heating resistor 222A in the direction indicated by an arrow a1 of FIG. 12 from the electrode 223A to the electrode 224A, and the current flows through the heating resistor 232A in the direction indicated by an arrow a2 of FIG. 12 from the electrode 233A to the electrode 234A. Thus, in an area between the heating resistor 222A and the heating resistor 232A, a direction b1 of the magnetic field generated from the heating resistor 222A is opposite to a direction b2 of the magnetic field generated from the heating resistor 232A. By this, in the gas cell 21, the magnetic field generated from the heating resistor 222A and the magnetic field generated from the heating resistor 232A can be mutually cancelled or weakened.

Incidentally, in this embodiment, although the substrate 221A (substrate 231A) intervenes between the heating resistor 222A (heating resistor 232A) and the gas cell 21, no limitation is made to this, and the heating resistor 222A (heating resistor 232A) may be directly provided on the surface of the gas cell 21.

Also according to the gas cell unit 2A of the second embodiment, the frequency accuracy can be improved.

Third Embodiment

Next, a third embodiment of the invention will be described.

Figure 13:
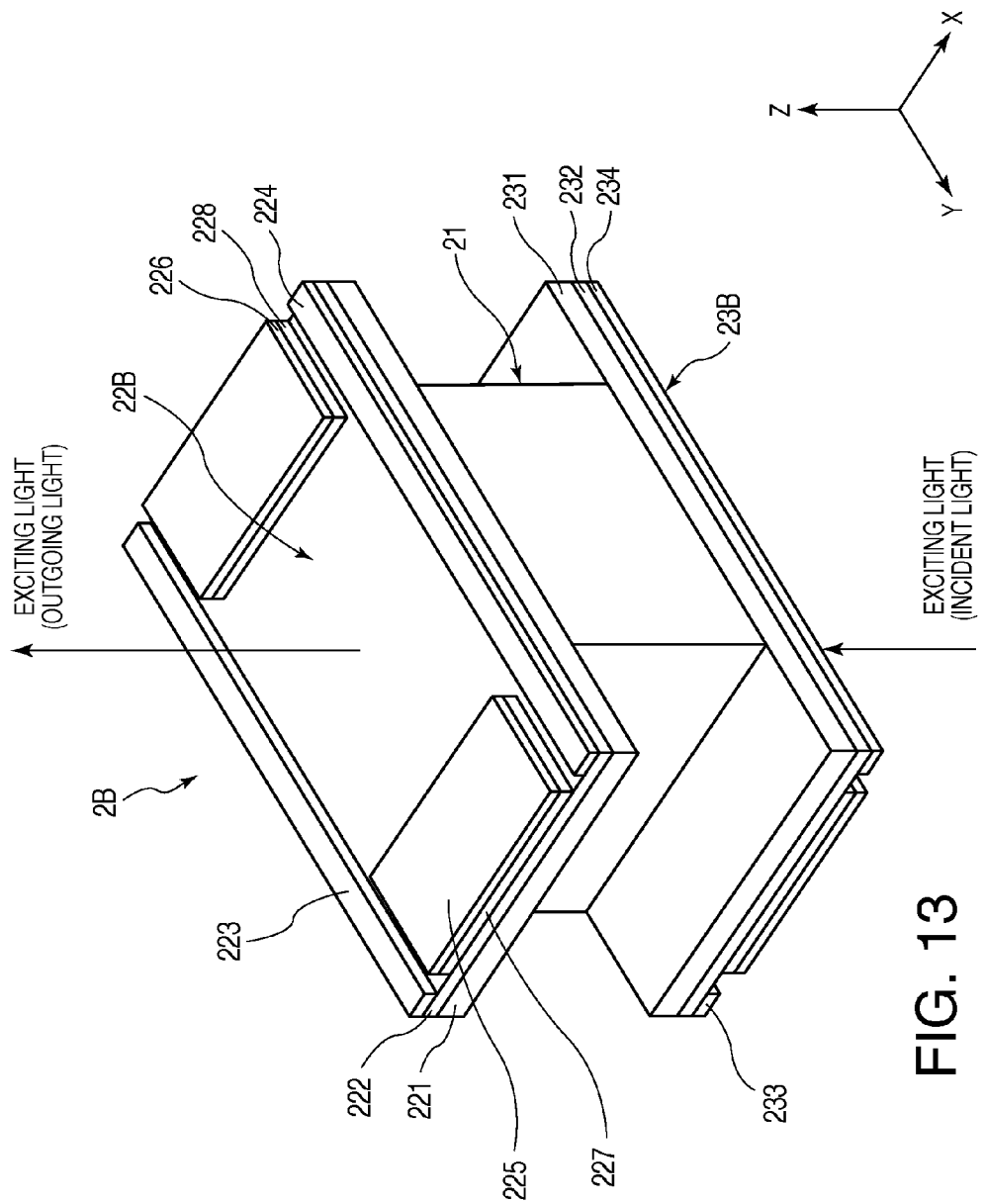
FIG. 13 is a perspective view showing a schematic structure of a gas cell unit of a third embodiment of the invention.

FIG. 13 is a perspective view showing a schematic structure of a gas cell unit of the third embodiment of the invention.

The gas cell unit of this embodiment is similar to the gas cell unit of the first embodiment except for the structure of a heater.

Incidentally, in the following description, with respect to the gas cell unit of the third embodiment, different points from the first embodiment will be mainly described, and the description of similar items will be omitted. Besides, in FIG. 13, a similar component to that of the foregoing embodiment is denoted by the same reference numeral.

A gas cell unit 2B shown in FIG. 13 includes a pair of heaters 22B and 23B provided to sandwich a gas cell 21.

Hereinafter, the heater 22B will be described. Incidentally, since the structure of the heater 23B is similar to the heater 22B, the description thereof will be omitted.

The heater (first heater) 22B includes a substrate (first substrate) 221, a heating resistor (first heating resistor) 222 provided on one surface of the substrate 221, a pair of electrodes 223 and 224 provided on the heating resistor 222, and a pair of magnetic shielding electrodes 225 and 226.

That is, the heater 22B is such that the pair of magnetic shielding electrodes 225 and 226 are provided on the heating resistor 222 in the heater 22 of the first embodiment.

The pair of magnetic shielding electrodes 225 and 226 are provided along a pair of short sides on the heating resistor 222. By this, the variation of the magnetic field of the whole area in an area (space S) of the gas cell 21 in which an alkali metal atom is sealed can be more certainly suppressed.

Besides, in this embodiment, the magnetic shielding electrode 225 is provided on the heating resistor 222 through an insulating layer 227. Similarly, the magnetic shielding electrode 226 is provided on the heating resistor 222 through an insulating layer 228. By providing the insulating layers 227 and 228, the respective magnetic shielding electrodes 225 and 226 can shield the magnetic field without inhibiting heat generation of the heating resistor 222 by energization to the pair of electrodes 223 and 224.

A constituent material of the insulating layers 227 and 228 is not specifically limited as long as the material has an insulating property and film formation can be performed, and for example, resin material, ceramic material and the like can be enumerated.

Besides, each of the magnetic shielding electrodes 225 and 226 has a band shape extending in the X-axis direction.

A constituent material of the magnetic shielding electrodes 225 and 226 is not specifically limited, and for example, ferromagnetic material such as iron, cobalt and nickel can be enumerated.

Also according to the gas cell unit 2B of the third embodiment, the frequency accuracy can be improved.

Fourth Embodiment

Next, a fourth embodiment of the invention will be described.

Figure 14:
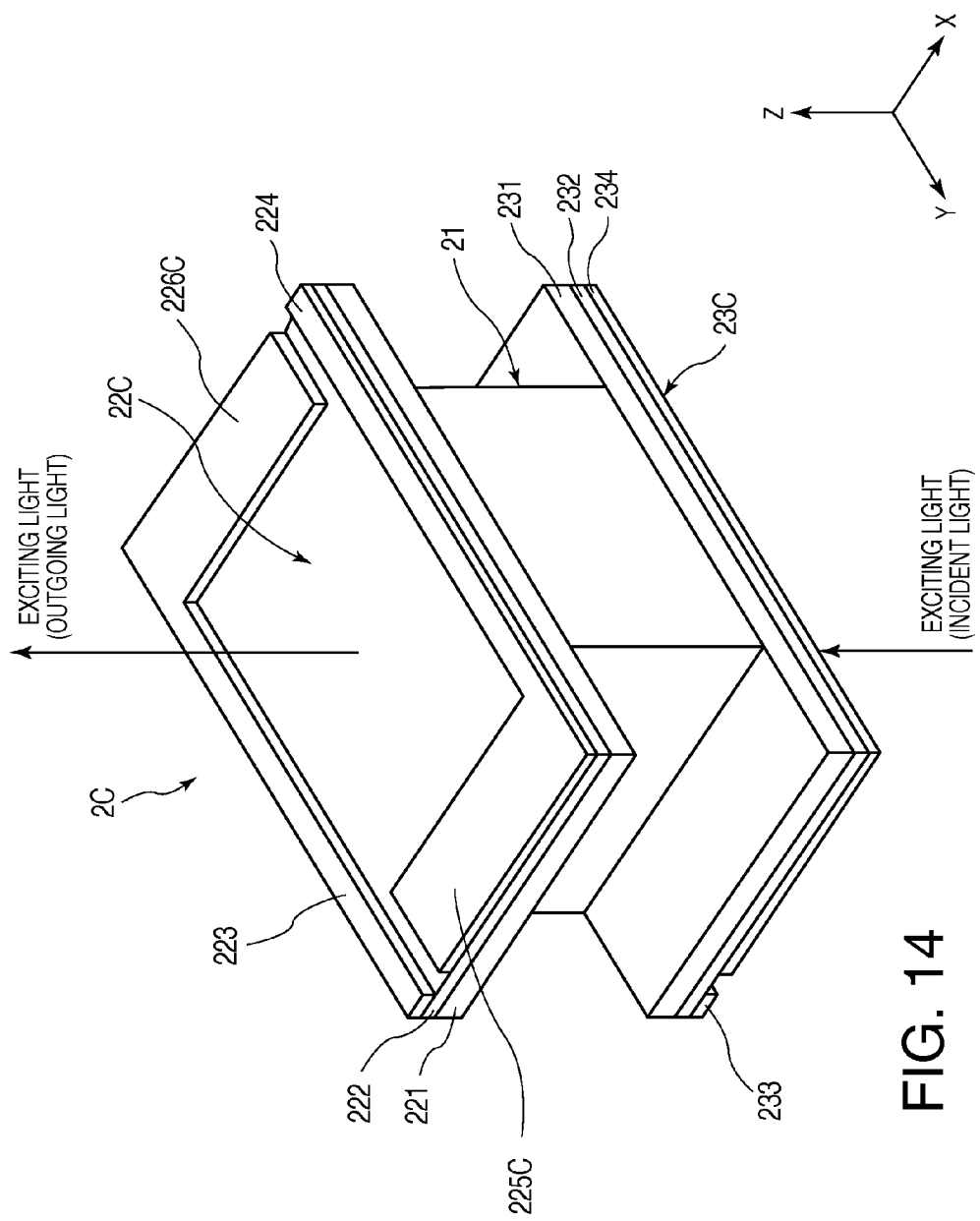
FIG. 14 is a perspective view showing a schematic structure of a gas cell unit of a fourth embodiment of the invention.

FIG. 14 is a perspective view showing a schematic structure of a gas cell unit of the fourth embodiment of the invention.

The gas cell unit of this embodiment is similar to the gas cell unit of the first embodiment except for the structure of a heater.

Incidentally, in the following description, with respect to the gas cell unit of the fourth embodiment, different points from the first embodiment will be mainly described, and the description of similar items will be omitted. Besides, in FIG. 14, a similar component to that of the foregoing embodiment is denoted by the same reference numeral.

A gas cell unit 2C shown in FIG. 14 includes a pair of heaters 22C and 23C provided to sandwich a gas cell 21.

Hereinafter, the heater 22C will be described. Incidentally, since the structure of the heater 23C is similar to the structure of the heater 22C, the description thereof will be omitted.

The heater (first heater) 22C includes a substrate (first substrate) 221, a heating resistor (first heating resistor) 222 provided on one surface of the substrate 221, a pair of electrodes 223 and 224 provided on the heating resistor 222 and a pair of magnetic shielding conductors 225C and 226C.

That is, the heater 22C is such that the pair of magnetic shielding conductors 225C and 226C are provided on the heating resistor 222 in the heater 22 of the first embodiment.

The pair of magnetic shielding conductors 225C and 226C are provided along a pair of short sides on the heating resistor 222. By this, the variation of the magnetic field of the whole area in an area (space S) of the gas cell 21 in which an alkali metal atom is sealed can be more certainly suppressed.

Besides, the magnetic shielding conductor 225C is formed integrally with the electrode 224. Similarly, the magnetic shielding conductor 226C is formed integrally with the electrode 223. By this, the magnetic shielding conductor 225C functions as an electrode of the same polarity as the electrode 224, and the magnetic shielding conductor 226C functions as an electrode of the same polarity as the electrode 223. Accordingly, the heating resistor 222 is heated by energization to the pair of electrodes 223 and 224 and energization to the pair of magnetic shielding conductors 225C and 226C, and the magnetic shielding conductors 225C and 226C can shield the magnetic field.

Also according to the gas cell unit 2C of the fourth embodiment, the frequency accuracy can be improved.

Fifth Embodiment

Next, a fifth embodiment of the invention will be described.

FIG. 15 is a plan view showing a gas cell unit of the fifth embodiment of the invention.

The gas cell unit of this embodiment is similar to the gas cell unit of the first embodiment except for the structure of a gas cell and a heater. Besides, the gas cell unit of this embodiment is similar to the gas cell unit of the second embodiment except for the structure of the gas cell.

Incidentally, in the following description, with respect to the gas cell unit of the fifth embodiment, different points from the first embodiment will be mainly described, and the description of similar items will be omitted. Besides, in FIG. 15, a similar component to that of the foregoing embodiment is denoted by the same reference numeral.

A gas cell unit 2D shown in FIG. 15 includes a gas cell 21D.

An area (space S) of the gas cell 21D in which an alkali metal atom is sealed has a longitudinal shape extending in a direction parallel to the direction of current flowing through a heating resistor 222A when the heating resistor 222A is viewed in plane. In this embodiment, the space S has an elliptical shape having a long axis extending in the direction parallel to the direction of the current flowing through the heating resistor 222A when the heating resistor 222A is viewed in plane. By this, the variation of the magnetic field of the whole area in the area (space S) of the gas cell 21 in which the alkali metal atom is sealed can be more certainly suppressed.

Also according to the gas cell unit 2D of the fifth embodiment as described above, the frequency accuracy can be improved.

Sixth Embodiment

Next, a sixth embodiment will be described.

FIG. 16 is a plan view showing a gas cell unit of the sixth embodiment of the invention.

The gas cell unit of this embodiment is similar to the gas cell unit of the first embodiment except for the structure of a heater.

Incidentally, in the following description, with respect to the gas cell unit of the sixth embodiment, different points from the first embodiment will be mainly described, and the description of similar items will be omitted. Besides, in FIG. 16, a similar component to that of the foregoing embodiment is denoted by the same reference numeral.

A gas cell unit 2E shown in FIG. 16 includes a heater (first heater) 22E to heat a gas cell 21. Incidentally, although not shown, in the gas cell unit 2E, a heater (second heater) having a similar structure to the heater 22E is provided to face the heater 22E through the gas cell 21.

The heater 22E includes a substrate 221E, a heating resistor (first heating resistor) 222E provided on one surface of the substrate 221E, and a pair of electrodes 223 and 224 provided on the heating resistor 222E.

In this embodiment, each of the substrate 221E and the heating resistor 222E is quadrangular (more specifically, square) when viewed in plane.

Besides, as shown in FIG. 16, the heating resistor 222E includes an area (space S) of the gas cell 21 in which an alkali metal atom is sealed when viewed in plane, and extends to the outside of the area (space S). In this embodiment, the heating resistor 222E has a shape larger than the area (space S) of the gas cell 21 in which the alkali metal atom is sealed when viewed in plane. By this, the variation of the magnetic field of the whole area in the space S can be suppressed. As a result, the frequency accuracy can be easily and certainly improved.

Also according to the gas cell unit 2E of the sixth embodiment as described above, the frequency accuracy can be improved.

Although the gas cell unit and the atomic oscillator according to the invention have been described based on the illustrated embodiments, the invention is not limited to these.

Besides, the respective components of the gas cell unit and the atomic oscillator according to the invention can be replaced by arbitrary components having the same function, and arbitrary components can also be added.

Besides, in the gas cell unit and the atomic oscillator according to the invention, arbitrary components of the foregoing embodiments may be combined with each other.

For example, in the foregoing embodiment, although the description is made on the case where the two heaters (the first heater, the second heater) provided in the gas cell unit have the same structure, one heater and the other heater may have different structures.

Besides, the number of heaters provided in the gas cell unit may be three or more.

Besides, in the foregoing embodiments, although the description is made on the case where the two temperature sensors are provided, the number of temperature sensors may be one or three or more.

The entire disclosure of Japanese Patent Application No. 2011-163706, filed Jul. 26, 2011 is expressly incorporated by reference herein.

What is claimed is:

1. A gas cell unit comprising:
a gas cell in which a gaseous alkali metal atom is sealed;
a first heating resistor that is heated by energization and heats the gas cell; and
a second heating resistor that is heated by energization and heats the gas cell, wherein
the first heating resistor and the second heating resistor face each other across the gas cell,
a current flowing through the first heating resistor and a current flowing through the second heating resistor include current components flowing in a same direction, and a magnetic field generated in the gas cell by the energization to the first heating resistor and a magnetic field generated in the gas cell by the energization to the second heating resistor mutually weaken strengths of the magnetic fields in the gas cell, and
each of the first heating resistor and the second heating resistor is rectangular when viewed in plane, and the current flows in a direction parallel to a short side.

2. The gas cell unit according to claim 1, wherein each of the first heating resistor and the second heating resistor extends to an outside of an area of the gas cell in which the alkali metal atom is sealed when viewed in plane.

3. The gas cell unit according to claim 1, wherein a pair of electrodes are provided along a pair of long sides on each of the first heating resistor and the second heating resistor.

4. The gas cell unit according to claim 3, wherein a pair of magnetic shielding conductors are provided along a pair of short sides on each of the first heating resistor and the second heating resistor.

5. The gas cell unit according to claim 1, further comprising:
a first heater including the first heating resistor and a first substrate on one surface of which the first heating resistor is provided; and
a second heater including the second heating resistor and a second substrate on one surface of which the second heating resistor is provided.

6. An atomic oscillator comprising:
a gas cell unit according to claim 1;
a light exit part to emit an exciting light to excite the alkali metal atom; and
a light detection part to detect an intensity of the exciting light passing through the gas cell.

* * * * *